(12) United States Patent
Im et al.

(10) Patent No.: US 11,146,148 B2
(45) Date of Patent: Oct. 12, 2021

(54) BLDC MOTOR INTEGRATED WITH INVERTER

(71) Applicant: Hanon Systems, Daejeon (KR)

(72) Inventors: Ho Bin Im, Daejeon (KR); Hee Kwon Park, Daejeon (KR); Hyeon Jae Shin, Daejeon (KR); Jae Won Lee, Daejeon (KR); Kyung Hun Jung, Daejeon (KR); Seong Kook Cho, Daejeon (KR); Ho Youn Kim, Daejeon (KR)

(73) Assignee: Hanon Systems, Daejeon (KR)

( * ) Notice: Subject to any disclaimer, the term of this patent is extended or adjusted under 35 U.S.C. 154(b) by 169 days.

(21) Appl. No.: 16/464,758

(22) PCT Filed: Apr. 5, 2018

(86) PCT No.: PCT/KR2018/004006
§ 371 (c)(1),
(2) Date: May 29, 2019

(87) PCT Pub. No.: WO2019/004572
PCT Pub. Date: Jan. 3, 2019

(65) Prior Publication Data
US 2019/0386547 A1 Dec. 19, 2019

(30) Foreign Application Priority Data

Jun. 30, 2017 (KR) .................. 10-2017-0083135
Jul. 17, 2017 (KR) .................. 10-2017-0090177

(51) Int. Cl.
*H02K 11/02* (2016.01)
*H02K 11/33* (2016.01)
(Continued)

(52) U.S. Cl.
CPC ............... *H02K 11/02* (2013.01); *H02K 9/02* (2013.01); *H02K 9/22* (2013.01); *H02K 11/0094* (2013.01);
(Continued)

(58) Field of Classification Search
CPC ...... H02K 11/02; H02K 11/33; H02K 11/048; H02K 5/225; H02K 2211/03; H02K 11/30; H02K 11/05
See application file for complete search history.

(56) References Cited

U.S. PATENT DOCUMENTS

2013/0300264 A1* 11/2013 Fujimoto ................. H02K 5/22
310/68 D
2015/0084446 A1 3/2015 Siamak

FOREIGN PATENT DOCUMENTS

CN          105827060 A    8/2016
JP          5522504 B2     6/2014
(Continued)

OTHER PUBLICATIONS

International Search Report issued in PCT/KR2018/004006 dated Jul. 13, 2018.

*Primary Examiner* — Terrance L Kenerly
(74) *Attorney, Agent, or Firm* — Norton Rose Fulbright US LLP; James R. Crawford (57) ABSTRACT

The present invention relates to a BLDC motor integrated with an inverter, having a motor and an inverter part that are integrally formed, and to a BLDC motor integrated with an inverter, having an improved arrangement of switching elements mounted on a PCB substrate of an inverter part and three phase terminals of a stator coil such that the inverter part including the PCB substrate can be compactly formed.

19 Claims, 11 Drawing Sheets

(51) Int. Cl.
*H02K 9/02* (2006.01)
*H02K 9/22* (2006.01)
*H02K 11/00* (2016.01)
*H02M 7/00* (2006.01)
*H05K 1/02* (2006.01)
*H05K 1/18* (2006.01)
*H05K 7/20* (2006.01)

(52) U.S. Cl.
CPC ............ *H02K 11/33* (2016.01); *H02M 7/003* (2013.01); *H05K 1/0203* (2013.01); *H05K 1/0231* (2013.01); *H05K 1/0233* (2013.01); *H05K 1/181* (2013.01); *H05K 7/209* (2013.01); *H05K 2201/066* (2013.01); *H05K 2201/10166* (2013.01)

(56) References Cited

FOREIGN PATENT DOCUMENTS

| | | | |
|---|---|---|---|
| JP | 2016082735 A | | 5/2016 |
| KR | 20080028563 A | | 4/2008 |
| KR | 20150072227 A | | 6/2015 |
| KR | 20150072912 A | * | 6/2015 |
| KR | 20150072912 A | | 6/2015 |

* cited by examiner

FIG. 11

BLDC MOTOR INTEGRATED WITH INVERTER

This patent application is a national phase under 35 U.S.C. § 371 of International Application No. PCT/KR2018/004006 filed Apr. 5, 2018, which claims priority from Korean Patent Application No. 10-2017-0083135, filed Jun. 30, 2017, and Korean Patent Application No. 10-2017-0090177, filed Jul. 17, 2017, each of which is hereby incorporated herein by reference in its entirety for all purposes.

TECHNICAL FIELD

The present invention relates to a brushless direct current (BLDC) motor integrated with an inverter (or an inverter integrated BLDC motor) in which a BLDC motor and an inverter are integrated to be compact.

BACKGROUND ART

A brushless direct current (BLDC) motor is a motor including an electronic commutation mechanism without a brush and a commutator of a DC motor. The BLDC motor is free from frictional contact and wear, which are the shortcomings of a conventional DC motor, and has relatively high efficiency, and thus, recently, hybrid vehicles tend to employ BLDC motors as motors for rotating cooling fans.

A conventional BLDC motor assembly for a low-voltage cooling fan for vehicles includes an inverter integrated BLDC motor in which a motor and an inverter part are integrated. In this case, the inverter part includes a printed circuit board (PCB) on which various electronic elements including switching elements for controlling the motor are mounted, and the switching elements mounted on the PCB are electrically connected to a three phase terminal of a coil configuring a stator of the motor.

Therefore, in the conventional inverter integrated BLDC motor, it is difficult to make the inverter part including the PCB compact due to the form of the switching elements and electronic elements mounted on the PCB, a connection structure between the switching elements and the three phase terminal of the stator coil, a heat dissipation structure of the electronic elements, and the like.

[Related art document] [Patent document] JP 2016-082735 A (2016 May 16)

DISCLOSURE

Technical Problem

An object of the present invention is to provide an inverter-integrated type brushless direct current (BLDC) motor including a compact inverter part including a PCB by improving an arrangement of switching elements mounted on the PCB of the inverter part and three phase terminals of a stator coil.

Technical Solution

In one general aspect, an inverter-integrated type brushless direct current (BLDC) motor 1000 may include: a motor 100 including three phase terminals 120 electrically connected to a driving coil 111 of a stator 110 and arranged to be spaced apart from each other in a circumferential direction with respect to a central axis of the stator 110; and an inverter part 200 coupled to the motor 100 and having a PCB 210 on which switching elements 220 are mounted such that the three phase terminals 120 are coupled to the PCB 210 and are electrically connected to the switching elements 220, wherein one or more of the switching elements 220 may be arranged in a radial direction on an inner side of a circumferential line L in which the three phase terminals 120 are arranged.

The inverter part 200 includes the inverter housing 201 having a shape of a concave container, coupled to the motor 100 on an outer side thereof, and having the PCB 210 provided on an inner side thereof. The inverter housing 201 includes through holes 201a formed in a penetrating manner between the motor 100 and the PCB 210, so that the other sides of the three phase terminals 120, whose one sides are coupled and fixed to the stator 110, pass through the through holes 201a of the inverter housing 201 so as to be coupled to the PCB 210.

Board side PCB terminals 212 are formed on the PCB 210, through holes 213 penetrating through opposing sides of the PCB 210 may be formed close to the board side PCB terminal 212, and the three phase terminals 120 may be coupled to the board side PCB terminal 212 through the through holes 213 of the PCB 210.

The inverter integrated BLDC motor may further include a capacitor 230 and an electromagnetic wave shielding filter 240 mounted on the PCB 210 and disposed on an outer region of the PCB 210.

Here, the inverter housing 201 may include seating recesses 201b that are concave on an inner surface thereof so that the capacitor 230 and the electromagnetic wave shielding filter 240 may be brought into contact with the seating recesses 201b.

The electromagnetic wave shielding filter 240 may include a core 241 in a cylindrical shape or a donut shape and a coil 242 wound around the core and alternately passing through an outer side and an inner side of the core 241.

The capacitor 230 and the electromagnetic wave shielding filter 240 may be arranged in parallel on one side of the outer region of the PCB 210.

One sides of the three phase terminals 120 may be coupled and fixed to the stator 110, and the three phase terminals 120 may extend in a height direction which is a direction of the central axis of the stator 110.

The three phase terminals 120 and the board side PCB terminal 212 may be in surface-contact with each other so as to be coupled.

One side of the board side PCB terminal 212 may be spaced apart from the through hole 213 formed in the PCB 210 and fixed to the PCB 210, and the other side thereof may be disposed at a position corresponding to the through hole 213 formed in the PCB 210, and one side and the other side of the board side PCB terminal 212 may be connected to each other by a bent portion.

Here, after the three phase terminals 120 and the board side PCB terminals 212 are arranged to be close to each other or to be in contact with each other in a facing manner, the three phase terminals 120 and the board side PCB terminals 212 may be coupled and electrically connected to each other using any one of soldering, laser welding, and electric resistance welding.

In another general aspect, an inverter integrated BLDC motor 1000 may include: a motor 100; an inverter housing 201 coupled to the motor 100 on one side thereof; and a PCB 210 coupled to the other side of the inverter housing 201 and spaced apart from the inverter housing 201 in other portions excluding the coupled portion, and allowing electronic elements including the switching elements 220 to be mounted thereon, wherein first heat dissipation fins 251 may protrude from a position corresponding to a portion coupled to the PCB 210 on one side of the inverter housing 201.

Also, a second heat dissipation fin 252 may protrude from one side of the inverter housing 201 at a position corresponding to a portion where the PCB 210 is spaced apart from the inverter housing 201.

Also, a surface area of the first heat dissipation fin 251 may be larger than a surface area of the second heat dissipation fin 252.

Also, a thermal grease 270 may be interposed between the inverter housing 201 and the PCB 210 so as to be in contact therewith.

The inverter integrated BLDC motor may further include a capacitor 230 and an electromagnetic wave shielding filter 240 mounted on the PCB 210 and disposed at an outer region of the PCB 210 so as to be in contact with the thermal grease 270 on the other side of the inverter housing 201. Protrusions 201c may protrude from one side of the inverter housing 201 at positions corresponding to the capacitor 230 and the electromagnetic wave shielding filter 240.

A cooling hole 260 may be formed to penetrate through one side and the other side of the inverter housing 201 on an outer side of the rim wall 201-2 surrounding the outer portion of the PCB 210 where the electronic elements are mounted.

The cooling hole 260 may be formed close to the first heat dissipation fin 251.

Also, a third first heat dissipation fin 253 may protrude from an outer surface of the rim wall 201-2 surrounding the outer portion of the PCB 210 where the electronic devices are mounted in the inverter housing 201.

The cooling hole 260 may penetrate through one side and the other side on an outer side of the rim wall 201-2 and the third heat dissipation fin 253 may be disposed close to the cooling hole 260.

Advantageous Effects

The inverter integrated BLDC motor according to the present invention may include the inverter part including the PCB which is formed to be compact due to the arrangement of the switching elements mounted on the PCB and the three phase terminals of the stator coil and have a reduced weight.

BEST MODE

Hereinafter, an inverter integrated BLDC motor having the above-described configuration will be described in detail with reference to the accompanying drawings.

Figure 1:
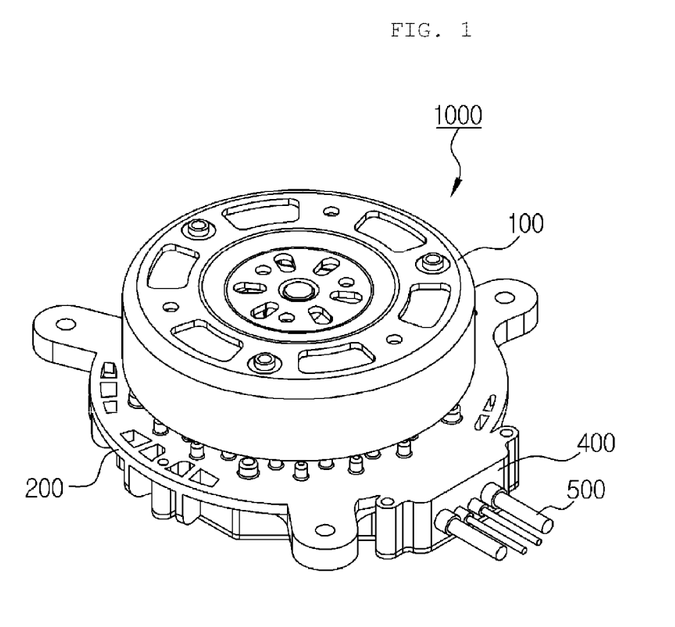
FIG. 1 is an assembled perspective view illustrating an inverter integrated BLDC motor according to an exemplary embodiment of the present invention.
Figure 2:
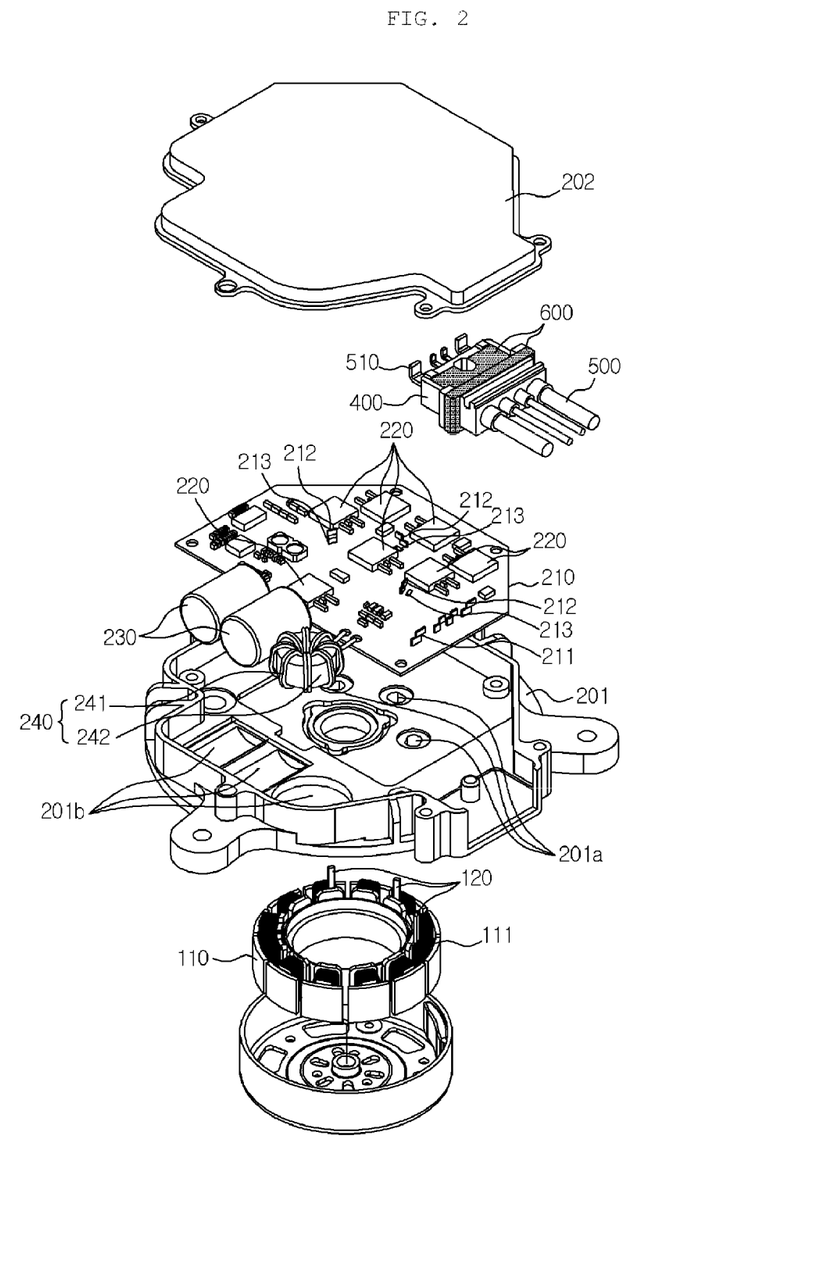
FIG. 2 is an exploded perspective view of the inverter integrated BLDC motor of FIG. 1 in a reversed state.
Figure 6:
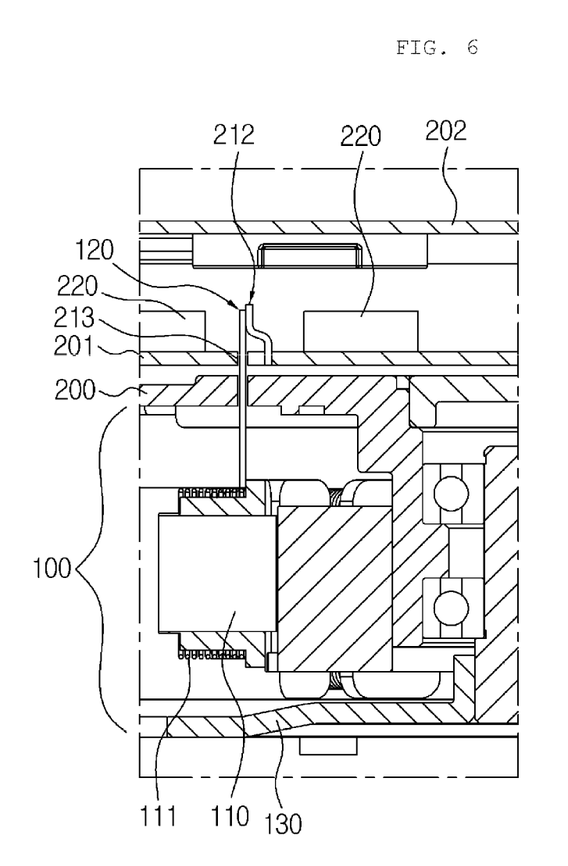
FIG. 6 is a front cross-sectional view illustrating a state in which three phase terminals are assembled to a PCB according to an exemplary embodiment of the present invention.

FIGS. 1 and 2 are an assembled perspective view and an exploded perspective view of an inverter integrated BLDC motor according to an exemplary embodiment of the present invention, and FIG. 6 is a front cross-sectional view illustrating a state in which three phase terminals are assembled to a PCB according to an exemplary embodiment of the present invention.

As illustrated, an inverter integrated BLDC motor 1000 of the present invention includes a motor 100 including three phase terminals 120 electrically connected to a driving coil 111 of a stator 110 and arranged to be spaced apart from each other in a circumferential direction with respect to a central axis of the stator 110; and an inverter part 200 coupled to the motor 100 and having a PCB 210 on which switching elements 220 are mounted such that the three phase terminals 120 are coupled to the PCB 210 and are electrically connected to the switching elements 220, wherein one or more of the switching elements 220 may be arranged in a radial direction on an inner side of a circumferential line L in which the three phase terminals 120 are arranged.

First, the motor 100 may be a brushless direct current (BLDC) motor. For example, the motor 100 may include a rotor 130 which has a permanent magnet coupled to an inner circumferential surface of a casing formed to have a concave container shape and the stator 110 disposed on an inner side of the rotor 130, spaced apart from the rotor 130, and having a driving coil 111 wound therearound. The stator 110 may be coupled and fixed to an outer side of an inverter housing 201 of the inverter part 200 (to be described hereinafter), and a rotary shaft of the rotor 130 may be coupled to the center of the casing and coupled to the inverter housing 201 by a bearing so that the rotor 130 may be rotatable in a state in which the inverter housing 201 is fixed. The stator 110 may include three phase terminals 120 electrically connected to the driving coil 111, and the three phase terminals 120 may be arranged to be spaced apart from each other in the circumferential direction with respect to a central axis of the stator 110. Here, as illustrated, one sides of the three phase terminals 120 may be coupled and fixed to the stator 110, and the three phase terminals 120 may extend in a height direction which is a direction of the central axis of the stator 110.

As illustrated, the inverter part 200 may include, for example, the inverter housing 201 formed to have a concave container shape and the PCB 210 provided in an internal space formed by a cover 202 coupled to the inverter housing 210, and switching elements 220 for controlling and supplying three-phase power to the motor 100 may be mounted on the PCB 210. The motor 100 may be coupled and fixed to an outer side of the inverter part 200, and the three phase terminals 120 of the motor 100 may be coupled and electrically connected to the switching elements 220 mounted on the PCB 210 of the inverter part 200.

Figure 5:
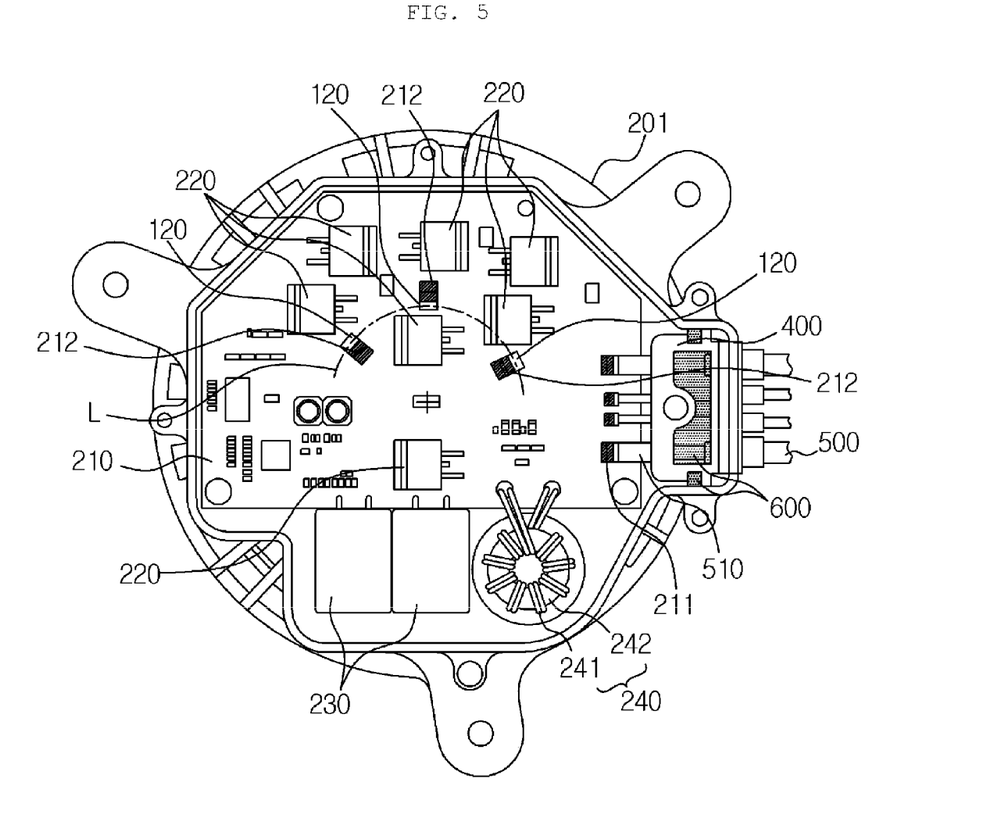
FIG. 5 is a top plan view illustrating a state in which three phase terminals are assembled to a PCB according to an exemplary embodiment of the present invention.

Here, one or more of the switching elements 220 may be disposed in the radial direction on the inner side of the circumferential line L in which the three phase terminals 120 are arranged. For example, as illustrated in FIG. 5, two switching elements 220 may be disposed radially on the inner side of the circumferential line L in which the three phase terminals 120 are disposed with respect to the center axis of the stator 110, and the other five switching elements 220 may be disposed radially on an outer side of the circumferential line L.

As a result, it is easy to arrange the switching elements 220 disposed radially outside the three phase terminals 120, and since a radial distance from the central axis to the switching element 220 may be relatively short, the PCB 210 may be formed to be compact. That is, an unnecessary outer region of the PCB 210 may be reduced in a width direction and length direction. Also, since a size of the PCB 210 is reduced, sizes of the inverter housing 201 accommodating the PCB and the cover 202 are reduced, thereby reducing a weight of the inverter part 200. Also, an outer rib having an arc shape is formed on an outer side of a rim wall of the inverter housing 201 using the reduced space, and a rib connecting the rib and the rim wall is formed to reinforce strength and enhance heat dissipation performance.

The inverter part 200 includes the inverter housing 201 having a shape of a concave container and coupled to the motor 100 on an outer side thereof and having the PCB 210 provided on an inner side thereof. The inverter housing 201 includes the through holes 201a formed in a penetrating manner between the motor 100 and the PCB 210, so that the other sides of the three phase terminals 120, whose one sides are coupled and fixed to the stator 110, may pass through the through holes 201a of the inverter housing 201 so as to be coupled to the PCB 210.

That is, referring to the drawings, the inverter part 200 may include the inverter housing 201 in the form of a container recessed downward in a height direction and the cover 202 covering an opened upper side of the inverter housing 201 in a height direction. The motor 100 may be coupled to an external lower surface of the inverter housing 201, and the PCB 210 may be provided in an internal space formed by coupling the inverter housing 201 and the cover 202. Here, the through holes 201a penetrating upper and lower surfaces may be formed in the inverter housing 201 located between the motor 100 and the PCB 210, and the three phase terminals 120, whose one sides are coupled to the stator 110, may be coupled to the PCB 210 through the through holes 201a of the inverter housing 201. Here, after the motor 100 is coupled to the inverter housing 201 by allowing the three phase terminals 120 to pass through the through holes 201a of the inverter housing 201, inner sides of the through holes 201a may be sealed using a sealant, or a sealing member may be formed in the through holes 201a so that the through holes 201a are sealed. Thereafter, the PCB 210 is inserted into and coupled to an inner side of the inverter housing 210 so that the three phase terminals 120 may be coupled to the PCB 210.

Accordingly, the three phase terminals 120 of the motor 100 and the PCB 210 of the inverter part 200 may be easily coupled and electrically connected.

Board side PCB terminals 212 are formed on the PCB 210, and through holes 213 penetrating through opposing sides of the PCB 210 may be formed close to the board side PCB terminal 212, and thus, the three phase terminals 120 may be coupled to the board side PCB terminal 212 through the through holes 213 of the PCB 210.

That is, the board side PCB terminals 212 may protrude upward from an upper surface of the PCB 210 and through holes 213 may penetrate through upper and lower surfaces of the PCB 210 close to the board side PCB terminals 212. Three board side PCB terminals 212 may be formed to be coupled to the three phase terminals, respectively, and through holes 213 are formed close to the board side PCB terminals 212, respectively, so that one board side PCB terminal 212 and one through hole 213 may be paired. As a result, the three phase terminals 120 may be coupled to the board side PCB terminals 212 through the through holes 213 of the PCB board 210. Here, the three phase terminals 120 and the board side PCB terminals 212 may be coupled to be in surface-contact with each other, and after three phase terminals 120 and the board side PCB terminals 212 are arranged to be close to each other or to be in contact with each other in a facing manner, they may be coupled and electrically connected to each other using any one of soldering, laser welding, and electric resistance welding. Also, one side of the board side PCB terminal 212 may be spaced apart from the through hole 213 formed in the PCB 210 and fixed to the PCB 210, and the other side thereof may be disposed at a position corresponding to the through hole 213 formed in the PCB 210. One side and the other side of the board side PCB terminal 212 may be connected to each other by a bent portion. Accordingly, the three phase terminals 120 passing through the through hole 213 formed in the PCB 210 may be easily in surface-contact and close contact with the board side PCB terminal 212.

The inverter integrated BLDC motor may further include a capacitor 230 and electromagnetic wave shielding filter 240 mounted on the PCB 210 and disposed on an outer region of the PCB 210.

That is, since the capacitor 230 and the electromagnetic wave shielding filter 240 are relatively voluminous, a connection portion of the capacitor 230 and a connection portion of the electromagnetic wave shielding filter 240 are coupled to the PCB 210, and here, the capacitor 230 and the electromagnetic wave shielding filter 240 are disposed at an outer region of the PCB 210 to make the inverter part 200 compact.

Here, the inverter housing 201 includes seating recesses 201b that are concave on an inner surface thereof so that the capacitor 230 and the electromagnetic wave shielding filter 240 may be brought into contact with the seating recesses 201b. As a result, the inverter part 200 may be formed to be compact also in the height direction.

The electromagnetic wave shielding filter 240 may include a core 241 in a cylindrical shape or a donut shape and a coil 242 wound around the core and alternately passing through an outer side and an inner side of the core 241.

Figure 3:
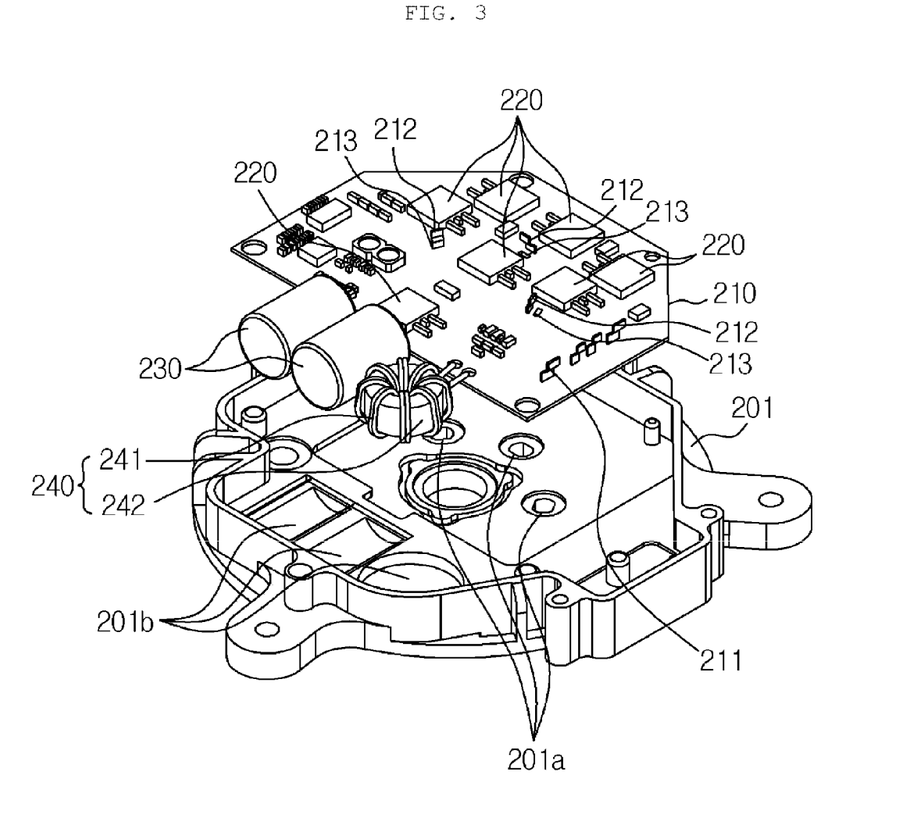
FIG. 3 is an exploded perspective view illustrating an inverter housing and a PCB according to an exemplary embodiment of the present invention.
Figure 4:
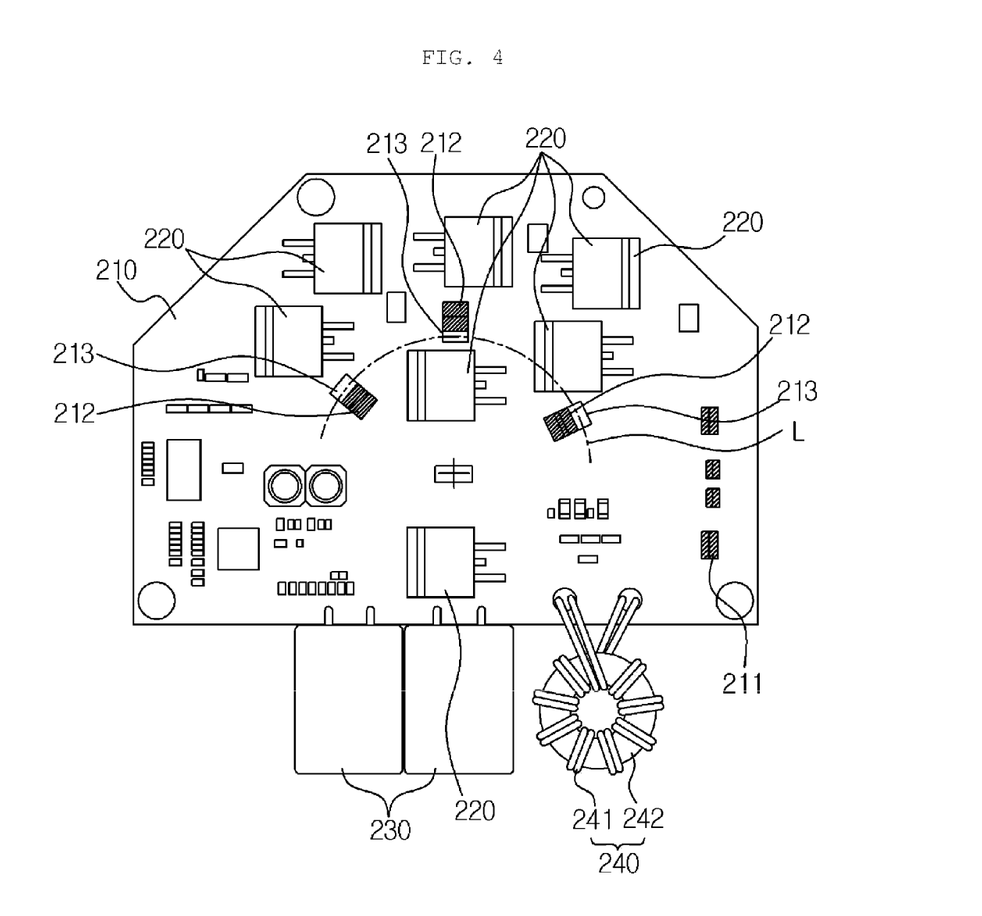
FIG. 4 is a top plan view of a PCB according to an exemplary embodiment of the present invention.

That is, as illustrated in FIGS. 3 to 5, since the electromagnetic wave shielding filter 240 is formed in a shape in which the coil 242 is wound around the cylindrical or donut-shaped core 241 and alternately passing through the outer side and the inner side of the cylindrical or donut-shaped core 241, electromagnetic wave shielding filter 240 may have a shorter width or length and is also short in the height direction, as compared with the existing electromagnetic wave shielding filter in which a coil is wound in a coil spring form around an outer circumferential surface of a cylindrical core, whereby the inverter part may be formed to be compact.

The capacitor 230 and the electromagnetic wave shielding filter 240 may be arranged in parallel on one side of the outer region of the PCB 210.

That is, when the capacitor 230 and the electromagnetic wave shielding filter 240 are arranged side by side in the width direction as illustrated in the drawings, if the electromagnetic wave shielding filter 240 formed as described above is applied, the inverter part may be formed to be compact.

The inverter part 200 has a portion which is open in the width direction, and thus, a connector block 400 may be coupled to block the open portion to seal the open portion. Here, electric wires 500 penetrate through and are coupled to the connector block 400, and a sealing portion 600 may be coupled to the connector block 400, and the connector block 400 and the electric wires 500 are sealed by the sealing portion 600, the connector block 400 and the inverter housing 201 may be sealed by a sealing portion 600, and the connector 400 and the cover 202 may be sealed by the sealing portion 600. Here, the sealing portion 600 may be a sealing material such as silicon or a sealing member such as an O-ring, or the like.

An electric wire side terminal 510 may be coupled to end portions of the electric wires 500 disposed inside the inverter part 200 through the connector block 400, and a board side terminal 211 may be formed at the PCB 210 and coupled and electrically connected to the electric wire side terminal 510.

Figure 7:
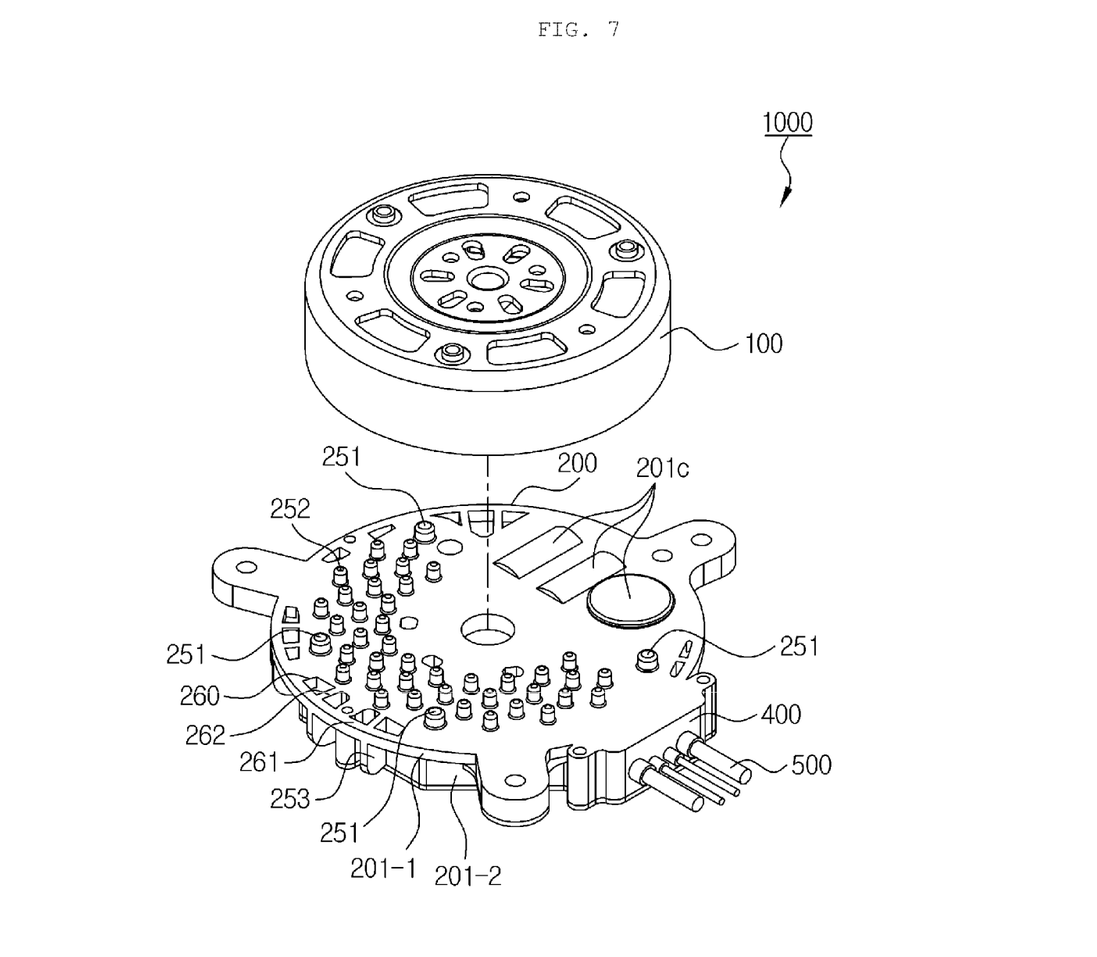
FIGS. 7 and 8 are an assembled perspective view and an exploded perspective view of an inverter integrated BLDC motor according to an exemplary embodiment of the present invention.
Figure 8:
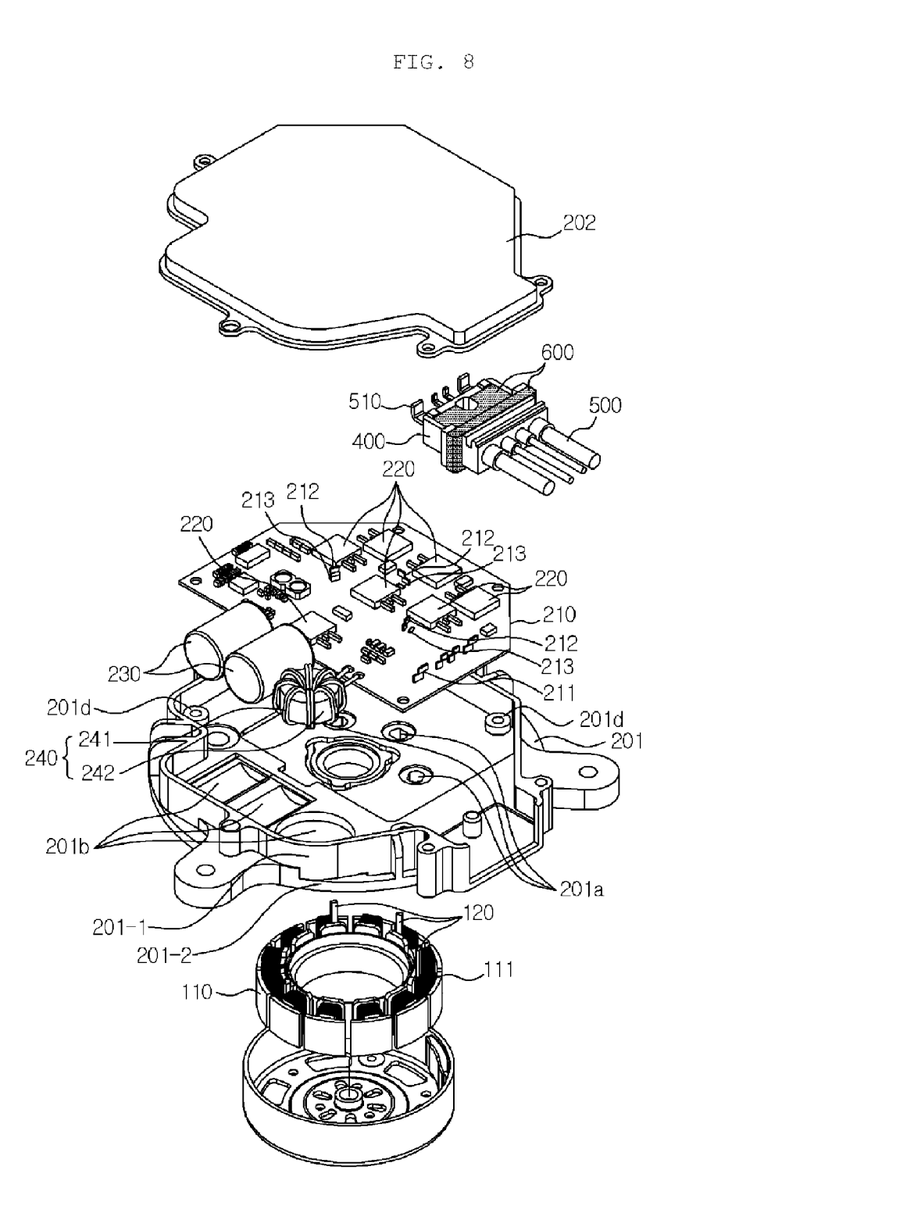
Figure 9:
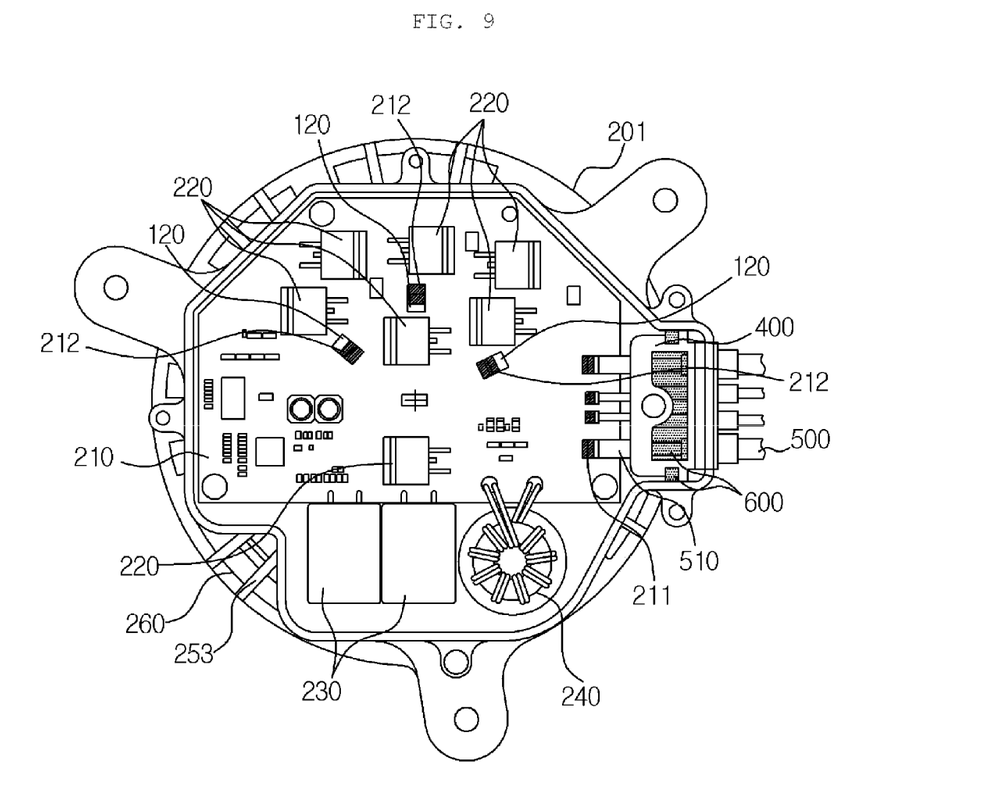
FIG. 9 is a plan view illustrating the inside of an inverter part of an inverter integrated BLDC motor according to an exemplary embodiment of the present invention.
Figure 10:
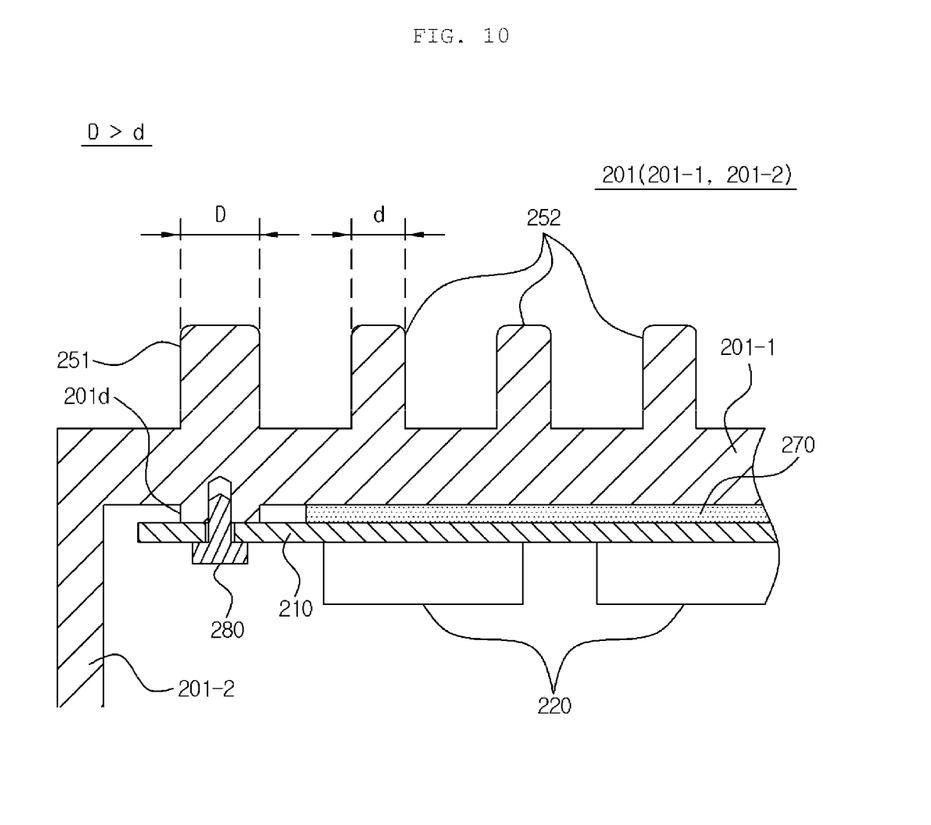
FIG. 10 is a schematic cross-sectional view illustrating an arrangement of heat dissipation fins of an inverter integrated BLDC motor according to an exemplary embodiment of the present invention.

FIGS. 7 and 8 are exploded perspective views illustrating an inverter integrated BLDC motor according to an exemplary embodiment of the present invention, FIG. 9 is a plan view illustrating the inside of an inverter part of an inverter integrated BLDC motor according to an exemplary embodiment of the present invention, and FIG. 10 is a schematic cross-sectional view illustrating the arrangement of heat dissipation fins of the inverter integrated BLDC motor according to the exemplary embodiment of the present invention.

As illustrated, an inverter integrated BLDC motor 1000 according to an exemplary embodiment of the present invention may include: a motor 100; an inverter housing 201 coupled to the motor 100 on one side thereof; and a PCB 210 coupled to the other side of the inverter housing 201 and spaced apart from the inverter housing 201 in other portions excluding the coupled portion, and allowing electronic elements including the switching elements 220 to be mounted thereon, in which a first heat dissipation fin 251 may protrude from a position corresponding to a portion coupled to the PCB 210 on one side of the inverter housing 201.

First, the inverter integrated BLDC motor 1000 of the present invention may be configured by integrally combining the motor 100 and the inverter part 200.

The motor 100 may be a brushless direct current (BLDC) motor. For example, the motor 100 may include a rotor 130 having a permanent magnet coupled to an inner circumferential surface of a casing formed in a concave container shape and the stator 110 disposed on the inner side of the rotor 130 and spaced apart from the rotor 130, and having the driving coil wound thereof. The stator 110 may be coupled and fixed to an outer side of an inverter housing 201 of the inverter part 200 (to be described hereinafter) and a rotary shaft of the rotor 130 may be coupled to the center of the casing and coupled to the inverter housing 201 by a bearing so that the rotor 130 may be rotatable in a state in which the inverter housing 201 is fixed. The stator 110 may include three phase terminals 120 electrically connected to the driving coil 111, and here, as illustrated, one sides of the three phase terminals 120 may be coupled and fixed to the stator 110, and the three phase terminals 120 may extend in a height direction which is a direction of the central axis of the stator 110.

As illustrated, the inverter part 200 may include, for example, the inverter housing 201 formed as a concave container and the PCB 210 provided in an internal space formed by a cover 202 coupled to the inverter housing 210, and switching elements 220 for controlling and supplying three-phase power to the motor 100 may be mounted on the PCB 210. The motor 100 may be coupled and fixed to an outer side of the inverter housing 201, and through holes 201a penetrating through the motor 100 and the PCB 210m may be formed. The other sides of the fixed three phase terminals 120, whose one sides are coupled to the stator 110, are coupled to the PCB 210 through the through holes 201a of the inverter housing 201, so that the three phase terminals 120 of the motor 100 may be coupled and electrically connected to the switching elements 220 mounted on the PCB 210. Also, in addition to the switching elements 220 such as MOSFETs, various electronic elements such as a gate driver, a main control unit (MCU), the capacitor 230, and a CM choke may be mounted on the PCB 210 to control the motor, and here, a larger amount of heat may be generated by the electronic elements when the motor operates.

Here, in the inverter housing 201, a rim wall 201-2 may extend in a height direction in the vicinity of the circumference of a base 201-1 disposed to be parallel to a width direction and a length direction, and the motor 100 may be coupled to an upper side of the base 201-1 which is one side of the inverter housing 201, and the PCB 201 may be coupled to a lower side of the base 201-1 which is the other side. Also, the PCB 210 may be partially supported by a support portion 201d protruding from a lower surface of the base 201-1 and spaced apart from the lower surface of the base 201-1 of the inverter housing 201. The PCB 210 may be coupled and fixed to the support portion 201d using a fastening member 280, or the like. As a result, the other portions of the PCB 210, excluding the portion coupled to the inverter housing 201, may be spaced apart from the inverter housing 201. Also, the first heat dissipation fin 251 protrudes upward from the upper surface of the base 201-1 which is one side of the inverter housing 201, and here, the heat dissipation fin 251 may be formed at a position corresponding to a position where the support portion 201d, which is a portion where the PCB 210 is supported by the inverter housing 201 and coupled, is formed.

Therefore, in the inverter integrated BLDC motor, heat generated by the electronic devices mounted on the PCB may be rapidly conducted to the first heat dissipation fin 251 through the support portion of the inverter housing 201 directly in close contact and coupled with the PCB 210 so as to be dissipated to the outside, whereby heat dissipation performance of the inverter part may be enhanced.

Also, a second heat dissipation fin 252 may protrude from one side of the inverter housing 201 at a position corresponding to a portion where the PCB 210 is spaced apart from the inverter housing 201.

That is, as illustrated, the second heat dissipation fin 252 may protrude upward from the upper surface of the base 201-1 which is one side of the inverter housing 201, and here, the second heat dissipation fin 252 may be formed in a range corresponding to an inner side region of the circumference of the PCB 201 which is a position corresponding to the PCB 210. As a result, heat generated by the electronic devices including the switching elements 220 disposed and mounted on the inner side of the circumference of the PCB 210 may be dissipated through the second heat dissipation fin 252, whereby the inverter part 200 may be rapidly cooled using the second heat dissipation fin 252 together with the first heat dissipation fins 251.

Here, a surface area of the first heat dissipation fin 251 may be larger than a surface area of the second heat dissipation fin 252.

That is, the surface area of the first heat dissipation fin 251 may be larger than the surface area of the second heat dissipation fin 252 so that heat of the PCB 210 may be dissipated rapidly to the outside through the first heat dissipation fin 251. Here, the surface area of one first heat dissipation fin 251 may be larger than the surface area of one second heat dissipation fin 252. For example, as illustrated, both the first heat dissipation fin 251 and the second heat dissipation fin 252 may have a cylindrical shape, protrude upward from the upper surface of the base 201-1 of the inverter housing 201, and have the same height, and an outer diameter D of the first heat dissipation fin 251 may be larger than an outer diameter d of the second heat dissipation fin 252.

Also, a thermal grease 270 may be interposed between the inverter housing 201 and the PCB 210 so as to be in contact therewith.

That is, after the thermal grease 270 is applied to a lower surface of the base 201-1 of the inverter housing 201, the PCB 210 is coupled to the inverter housing 201 so that the thermal grease 270 fills a space between the lower surface of the base 201-1 and the PCB 210, whereby heat of the PCB 210 side may be easily conducted to the inverter housing 201 through the thermal grease 270, and thus, heat may be rapidly dissipated through the second heat dissipation fin 252.

The inverter integrated BLDC motor may further include the capacitor 230 and the electromagnetic wave shielding filter 240 mounted on the PCB 210 and disposed at an outer region of the PCB 210 so as to be in contact with the thermal grease 270 on the other side of the inverter housing 201. Protrusions 201c may protrude from one side of the inverter housing 201 at positions corresponding to the capacitor 230 and the electromagnetic wave shielding filter 240.

That is, as illustrated in FIG. 9, an electrically connected portion is coupled to the PCB 210, and the capacitor 230 and the electromagnetic wave shielding filter 240 main body may be disposed in an outer region of the circumference of the PCB 210. Here, referring to FIG. 11, the seating recesses 201b are formed to be concave from the lower surface of the base 201-1 which is an inner surface of the inverter housing 201, so that the capacitor 230 and the electromagnetic wave shielding filter 240 may be seated so as to be in contact with the seating recesses 201b.

Figure 11:
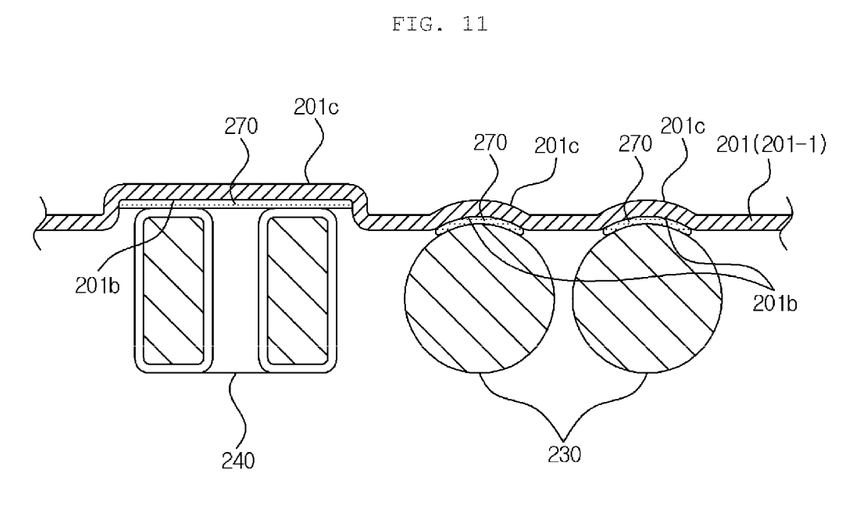
FIG. 11 is a schematic cross-sectional view of a portion of an inverter integrated BLDC motor according to an exemplary embodiment of the present invention where a capacitor and an electromagnetic wave shielding filter are disposed.

Here, after the thermal grease 270 is applied to the seating recesses 210b, the capacitor 230 and the electromagnetic wave shielding filter 240 are seated, and the protrusions 201c protrude upward from an upper surface of the base 201-1 at positions corresponding to the capacitor 230 and the electromagnetic wave shielding filter 240, so that heat generated by the capacitor 230 and the electromagnetic wave shielding filter 240 may be easily dissipated to the outside of the inverter part 200 through the inverter housing 201.

A cooling hole 260 may be formed to penetrate through one side and the other side of the inverter housing 201 on an outer side of the rim wall 201-2 surrounding the outer portion of the PCB 210 where the electronic elements are mounted.

That is, as illustrated, the inverter housing 201 has the rim wall 201-2 downward from a lower surface of the base 201-1 in a height direction so that the PCB 210 may be accommodated in an internal space surrounded by the rim wall 201-2, and the cooling holes 260 may be formed to penetrate through upper and lower surfaces in an outer portion of the rim wall 201-2 among edges of the base 201-1. Accordingly, heat dissipation performance of the inverter part 200 may be further enhanced by the cooling holes 260.

The plurality of cooling holes 260 may be spaced apart from each other along the inner side of the circumference of the base 201-1 of the inverter housing 201, and a heat dissipation area may be formed to be large by outer ribs 261 forming an outer portion of the base 201-1 in the portion where the cooling holes 260 are formed and connection ribs 262 extending inward from the outer rib 261 in a radial direction. Also, the outer rib 261 and the connection rib 262 may extend downward from a lower surface of the base 201-1 and be coupled to the rim wall 201-2 to reinforce strength of the inverter housing 201 and enhance heat dissipation performance. Also, since the cooling hole 260 is formed at the edge portion of the base 201-1 and close to the first heat dissipation fin 251, heat dissipation performance of the first heat dissipation fin 251 may further be enhanced by the cooling hole 260. Also, a third first heat dissipation fin 253 may protrude from an outer surface of the rim wall 201-2 surrounding the outer portion of the PCB 210 where the electronic devices are mounted in the inverter housing 201. That is, since a third heat dissipation fin 253 protrudes from an outer surface of the rim wall 201-2 of the inverter housing 201, heat dissipation performance of the inverter housing 201 may be enhanced.

Further, the third heat dissipation fin 253 may be disposed close to the cooling hole 260 to improve cooling performance. Here, the third heat dissipation fin 253 may be integrally formed to be connected to the outer rib 261 or the connection rib 262. The third heat dissipation fin 253 may be formed in a flat plate shape parallel to a flow direction of cooling air passing through the cooling hole 260. In addition, the third first heat dissipation fin 253 may be formed to have various other shapes.

The present invention should not be construed to being limited to the above-mentioned embodiment. The present invention may be applied to various fields and may be variously modified by those skilled in the art without departing from the scope of the present invention claimed in the claims.

DESCRIPTION OF REFERENCE NUMERALS

1000: inverter integrated BLDC motor
100: motor, 110: stator, 111: driving coil
120: three phase terminal, 130: rotor
200: inverter part, 201: inverter housing, 201-1: base
201-2: rim wall, 201a: through hole, 201b: seating recess
201c: protrusion, 201d: support portion, 202: cover, 210: PCB
211: board side terminal, 212: board side PCB terminal, 213: through hole
220: switching element, 230: capacitor, 240: electromagnetic wave shielding filter
241: core, 242: coil, 251: first heat dissipation fin, 252: second heat dissipation fin
253: third heat dissipation fin, 260: cooling hole, 261: outer rib
262: connection rib, 270: thermal grease, 280: fastening unit 400: connector block, 500: electric wire, 510: electric wire side terminal
600: sealing portion

The invention claimed is:

1. An inverter-integrated type brushless direct current (BLDC) motor comprising:
a motor including three phase terminals electrically connected to a driving coil of a stator and arranged to be spaced apart from each other in a circumferential direction with respect to a central axis of the stator; and
an inverter part coupled to the motor and having a PCB on which switching elements are mounted such that the three phase terminals are coupled to the PCB and are electrically connected to the switching elements,
wherein the inverter part includes the inverter housing having a shape of a concave container, coupled to the motor on an outer side thereof, and having the PCB provided on an inner side thereof, and the inverter housing includes through holes formed in a penetrating manner between the motor and the PCB, so that the other sides of the three phase terminals, whose one sides are coupled and fixed to the stator, pass through the through holes of the inverter housing so as to be coupled to the PCB.

2. The inverter integrated BLDC motor of claim 1, wherein one or more of the switching elements are arranged in a radial direction on an inner side of a circumferential line L in which the three phase terminals are arranged.

3. The inverter integrated BLDC motor of claim 1, wherein
board side PCB terminals are formed on the PCB, through holes penetrating through opposing sides of the PCB are formed close to the board side PCB terminal, and the three phase terminals are coupled to the board side PCB terminal through the through holes of the PCB.

4. The inverter integrated BLDC motor of claim 3, wherein
the three phase terminals and the board side PCB terminal are in surface-contact with each other so as to be coupled.

5. The inverter integrated BLDC motor of claim 4, wherein
one side of the board side PCB terminal is spaced apart from the through hole formed in the PCB and fixed to the PCB, and the other side thereof is disposed at a position corresponding to the through hole formed in the PCB, and one side and the other side of the board side PCB terminal are connected to each other by a bent portion.

6. The inverter integrated BLDC motor of claim 3, wherein
after the three phase terminals and the board side PCB terminals are arranged to be close to each other or to be in contact with each other in a facing manner, the three phase terminals and the board side PCB terminals are coupled and electrically connected to each other using any one of soldering, laser welding, and electric resistance welding.

7. The inverter integrated BLDC motor of claim 1, further comprising a capacitor and an electromagnetic wave shielding filter mounted on the PCB and disposed on an outer region of the PCB.

8. The inverter integrated BLDC motor of claim 7, wherein
the inverter housing includes seating recesses that are concave on an inner surface thereof so that the capacitor and the electromagnetic wave shielding filter are brought into contact with the seating recesses.

9. The inverter integrated BLDC motor of claim 7, wherein
the electromagnetic wave shielding filter comprises a core in a cylindrical shape or a donut shape and a coil wound around the core and alternately passing through an outer side and an inner side of the core.

10. The inverter integrated BLDC motor of claim 7, wherein
the capacitor and the electromagnetic wave shielding filter are arranged in parallel on one side of the outer region of the PCB.

11. The inverter integrated BLDC motor of claim 1, wherein
one sides of the three phase terminals are coupled and fixed to the stator, and the three phase terminals extend in a height direction which is a direction of the central axis of the stator.

12. An inverter integrated BLDC motor comprising:
a motor;
an inverter housing coupled to the motor on one side thereof;
a PCB coupled to the other side of the inverter housing and spaced apart from the inverter housing in other portions excluding the coupled portion, and allowing electronic elements including the switching elements to be mounted thereon; and
a capacitor and an electromagnetic wave shielding filter mounted on the PCB and disposed at an outer region of the PCB so as to be in contact with the thermal grease on the other side of the inverter housing;
wherein a first heat dissipation fin protrudes from a position corresponding to a portion coupled to the PCB on one side of the inverter housing, and
wherein protrusions protrude from one side of the inverter housing at positions corresponding to the capacitor and the electromagnetic wave shielding filter.

13. The inverter integrated BLDC motor of claim 12, wherein
a second heat dissipation fin protrudes from one side of the inverter housing at a position corresponding to a portion where the PCB is spaced apart from the inverter housing.

14. The inverter integrated BLDC motor of claim 13, wherein
a surface area of the first heat dissipation fin is larger than a surface area of the second heat dissipation fin.

15. The inverter integrated BLDC motor of claim 13, wherein
a thermal grease is interposed between the inverter housing and the PCB so as to be in contact therewith.

16. The inverter integrated BLDC motor of claim 12, wherein
a cooling hole is formed to penetrate through one side and the other side of the inverter housing on an outer side of the rim wall surrounding the outer portion of the PCB where the electronic elements are mounted.

17. The inverter integrated BLDC motor of claim 16, wherein
the cooling hole is formed close to the first heat dissipation fin.

18. The inverter integrated BLDC motor of claim 12, wherein a third first heat dissipation fin protrudes from an outer surface of the rim wall surrounding the outer portion of the PCB where the electronic devices are mounted in the inverter housing.

19. The inverter integrated BLDC motor of claim 18, wherein
the cooling hole penetrates through one side and the other side on an outer side of the rim wall and the third heat dissipation fin is disposed close to the cooling hole.

* * * * *